(12) United States Patent
Seo et al.

(10) Patent No.: US 9,209,358 B2
(45) Date of Patent: Dec. 8, 2015

(54) SEMICONDUCTOR DEVICE AND METHOD OF FABRICATING THE SAME

(71) Applicant: Seoul Viosys Co., Ltd., Ansan-si (KR)

(72) Inventors: Won Cheol Seo, Ansan-si (KR); Dae Sung Cho, Ansan-si (KR); Chung Hoon Lee, Ansan-si (KR); Ki Bum Nam, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/365,370

(22) PCT Filed: Dec. 12, 2012

(86) PCT No.: PCT/KR2012/010765
§ 371 (c)(1),
(2) Date: Jun. 13, 2014

(87) PCT Pub. No.: WO2013/089417
PCT Pub. Date: Jun. 20, 2013

(65) Prior Publication Data
US 2014/0353679 A1 Dec. 4, 2014

(30) Foreign Application Priority Data

Dec. 14, 2011 (KR) .......... 10-2011-0134129
Dec. 15, 2011 (KR) .......... 10-2011-0135513
Dec. 21, 2011 (KR) .......... 10-2011-0139378

(51) Int. Cl.
*H01L 33/22* (2010.01)
*H01L 21/02* (2006.01)
(Continued)

(52) U.S. Cl.
CPC ............ *H01L 33/22* (2013.01); *H01L 21/0237* (2013.01); *H01L 21/0254* (2013.01); *H01L 21/02389* (2013.01); *H01L 21/02433* (2013.01); *H01L 21/02458* (2013.01); *H01L 21/02513* (2013.01); *H01L 33/007* (2013.01); *H01L 33/0075* (2013.01); *H01L 33/0079* (2013.01); *H01L 33/16* (2013.01); *H01L 33/32* (2013.01); *H01L 33/38* (2013.01); *H01L 33/42* (2013.01);
(Continued)

(58) Field of Classification Search
None
See application file for complete search history.

(56) References Cited

U.S. PATENT DOCUMENTS 7,821,024 B2    10/2010  Jeong
8,822,263 B2 *   9/2014  Koukitu et al. ............... 438/104
(Continued)

FOREIGN PATENT DOCUMENTS

JP    2007-266571    10/2007
JP    2009-016409     1/2009
(Continued)

OTHER PUBLICATIONS

International Search Report dated Apr. 22, 2013 in International Patent Application No. PCT/KR2012/010852.
(Continued)

*Primary Examiner* — Thao P Le
(74) *Attorney, Agent, or Firm* — H.C. Park & Associates, PLC

(57) ABSTRACT

Disclosed are a semiconductor device and a method of fabricating the same. A light emitting diode (LED) includes a conductive substrate, and a gallium nitride (GaN)-based semiconductor stack positioned on the conductive substrate. The semiconductor stack includes an active layer that is a semi-polar semiconductor layer. Accordingly, it is possible to provide an LED having improved light emitting efficiency.

19 Claims, 9 Drawing Sheets

(51) Int. Cl.
*H01L 33/16* (2010.01)
*H01L 33/32* (2010.01)
*H01L 33/00* (2010.01)
*H01L 33/38* (2010.01)
*H01L 33/42* (2010.01)
*H01L 33/46* (2010.01)

(52) U.S. Cl.
CPC ......... *H01L 33/46* (2013.01); *H01L 2933/0016* (2013.01); *H01L 2933/0058* (2013.01); *H01L 2933/0091* (2013.01)

(56) References Cited

U.S. PATENT DOCUMENTS

| | | | |
|---|---|---|---|
| 8,927,962 | B2 | 1/2015 | Ueno et al. |
| 2003/0141506 | A1 | 7/2003 | Sano et al. |
| 2006/0189020 | A1 | 8/2006 | Kim |
| 2008/0296626 | A1 | 12/2008 | Haskell et al. |
| 2008/0303033 | A1 | 12/2008 | Brandes |
| 2009/0212277 | A1 | 8/2009 | Akita et al. |
| 2009/0279278 | A1* | 11/2009 | Tsujimura et al. ............... 362/19 |
| 2010/0102297 | A1 | 4/2010 | Yoshizumi et al. |
| 2010/0219416 | A1 | 9/2010 | Farrell et al. |
| 2011/0089452 | A1 | 4/2011 | Jeong et al. |
| 2011/0097832 | A1 | 4/2011 | Fan et al. |
| 2011/0140122 | A1 | 6/2011 | Xu et al. |
| 2011/0182311 | A1* | 7/2011 | Yoshizumi et al. ...... 372/44.011 |
| 2011/0278538 | A1 | 11/2011 | Ko et al. |
| 2012/0076165 | A1* | 3/2012 | Chakraborty et al. ..... 372/45.01 |
| 2012/0193649 | A1 | 8/2012 | Donofrio et al. |
| 2013/0023079 | A1* | 1/2013 | Kang et al. ...................... 438/46 |

FOREIGN PATENT DOCUMENTS

| | | |
|---|---|---|
| JP | 2009-038344 | 12/2009 |
| JP | 2011-023539 | 2/2011 |
| JP | 2011-086909 | 4/2011 |
| JP | 2011-138839 | 7/2011 |
| JP | 2011-171394 | 9/2011 |
| JP | 2012-019217 | 1/2012 |
| KR | 10-2006-0093528 | 8/2006 |
| WO | 03/065464 | 8/2003 |
| WO | 2008-131735 | 11/2008 |
| WO | 2011-083551 | 7/2011 |
| WO | 2011-094391 | 8/2011 |

OTHER PUBLICATIONS

International Search Report dated Mar. 29, 2013 in International Patent Application No. PCT/KR2012/010765.
Non-Final Office Action dated May 12, 2015, in U.S. Appl. No. 14/364,281.
Notification of Reasons for Refusal issued on Sep. 15, 2015 in Japanese Patent Application No. 2014-547101.

* cited by examiner

SEMICONDUCTOR DEVICE AND METHOD OF FABRICATING THE SAME

CROSS-REFERENCE TO RELATED APPLICATIONS

This application is the National Stage of International Application No. PCT/KR2012/010765, filed on Dec. 12, 2012, and claims priority from and the benefit of Korean Patent Application No. 10-2011-0134129, filed on Dec. 14, 2011, Korean Patent Application No. 10-2011-0135513, filed on Dec. 15, 2011, and Korean Patent Application No. 10-2011-0139378, filed on Dec. 21, 2011, which are hereby incorporated by reference for all purposes as if fully set forth herein.

BACKGROUND

1. Field

The present invention relates to a semiconductor device and a method of fabricating the same, and more particularly, to a light emitting diode and a method of fabricating the same.

2. Discussion of the Background

A light emitting diode (LED) is a semiconductor device that emits light, and has characteristics of eco-friendliness, low voltage, long lifespan and low costs. Conventionally, LEDs were frequently applied to a lamp for a display, or a display of simple information such as numbers. However, with the development of industrial technologies, particularly information display and semiconductor technologies, the LEDs have recently used in various fields such as display, vehicle headlamp and projector fields.

Particularly, a gallium nitride (GaN)-based compound semiconductor is used for a visible or ultraviolet light emitting device, a high-power electronic device, or the like. A GaN-based compound semiconductor layer is generally grown on a substrate by using a growth method such as molecular beam epitaxy (MBE), metal-organic chemical vapor deposition (MOCVD) or hydride vapor phase epitaxy (HYPE).

The GaN-based compound semiconductor layer is generally grown on a heterogeneous substrate such as a sapphire substrate. Particularly, the GaN-based compound semiconductor layer is grown on a sapphire substrate having c-plane as a growth surface. The nitride semiconductor layer and the heterogeneous substrate have different lattice constants and different thermal expansion coefficients. Therefore, when the nitride semiconductor layer is grown on the heterogeneous substrate, many crystal defects occur in the nitride semiconductor layer.

These crystal defects cause deterioration of the characteristics of an electronic device or light emitting device including the nitride semiconductor layer, e.g., light emitting efficiency of the light emitting device.

Moreover, a GaN-based compound semiconductor layer grown in the c-axis direction has a polarity caused by spontaneous polarization and piezoelectric polarization. Therefore, the recombination rate of electrons and holes is lowered, and there is a limitation in improving the light emitting efficiency.

Meanwhile, another GaN-based compound semiconductor layer grown on a-plane or m-plane is non-polar, so that the spontaneous polarization or piezoelectric polarization does not occur in the GaN-based compound semiconductor layer. However, the growth of the GaN-based compound semiconductor layer on a-plane or m-plane has many problems to be solved, and therefore, has not been widely applied yet.

Meanwhile, semiconductor devices including LEDs are fabricated using various semiconductor device fabricating apparatuses, e.g., an inductively coupled plasma (ICP) apparatus, a plasma enhanced chemical vapor deposition (PECVD) apparatus, an electron-beam (E-beam) apparatus, a photolithography apparatus, and the like.

When the semiconductor devices are fabricated, a cassette in which a plurality of substrates are stacked in layers is used for the purpose of convenience in transferring and keeping the substrates.

However, in order to massively produce semiconductor devices, particularly LEDs, there have been many cases where a process is performed by loading a plurality of substrates into a semiconductor device fabricating apparatus. In this case, the semiconductor substrates stacked in layers are extracted one by one from a cassette and then loaded into the semiconductor device fabricating apparatus.

Accordingly, since the individual substrates are loaded one by one into the semiconductor device fabricating apparatus, there is a problem in that much loading time is required.

SUMMARY

An object of the present invention is to provide a light emitting diode (LED) and a method of fabricating the same, which can improve light emitting efficiency.

Another object of the present invention is to provide a method of fabricating a semi-polar LED using a GaN substrate.

A further object of the present invention is to provide a semiconductor device substrate having a seed layer which has a material, lattice constant or thermal expansion coefficient identical or similar to that of a semiconductor layer to be grown thereon, and a method of fabricating a semiconductor device using the semiconductor device substrate.

A still further object of the present invention is to provide a method of fabricating a semiconductor device, which can reduce time required to load a plurality of substrates into a semiconductor device fabricating apparatus.

According to an aspect of the present invention, there is provided a light emitting diode (LED) including: a conductive substrate; and a gallium nitride (GaN)-based semiconductor stack positioned on the conductive substrate. Here, the semiconductor stack includes an active layer that is a semi-polar semiconductor layer.

The GaN-based semiconductor stack may include semiconductor layers grown on a semi-polar GaN substrate. The semi-polar GaN substrate may be a miscut semi-polar GaN substrate having a principal surface inclined at an angle ranging from 15 to 80 degrees with respect to c-plane.

In some embodiments, the conductive substrate may be the semi-polar GaN substrate, but is not limited thereto. For example, the conductive substrate may be a metal substrate attached to the semiconductor stack. Further, a reflective layer may be positioned between the conductive substrate and the semiconductor stack.

The LED may further include a transparent oxide layer positioned on the semiconductor stack, and the transparent oxide layer may have a concavo-convex pattern. An upper surface of the semiconductor stack in contact with the transparent oxide layer may have a concavo-convex pattern.

According to another aspect of the present invention, there is provided a method of fabricating an LED, including: preparing a miscut semi-polar GaN substrate having a principal surface inclined at an angle ranging from 15 to 85 degrees with respect to c-plane; and growing semi-polar GaN-based semiconductor layers on the semi-polar GaN substrate to form a semiconductor stack.

The method may further include forming a transparent oxide layer on the semiconductor stack. The transparent oxide layer may have a concavo-convex pattern.

In some embodiments, the method may further include forming a reflective layer on the semiconductor stack; attaching a support substrate on the reflective layer; and removing the semi-polar GaN substrate.

Before the semiconductor stack is formed on the semi-polar GaN substrate, a nitride layer having a porous structure may be formed on the semi-polar GaN substrate using an electrochemical etching technique. The semi-polar GaN substrate may be separated from the semiconductor stack by using the nitride layer having the porous structure.

After the semi-polar GaN substrate is removed, a concavo-convex pattern may be formed on a surface of the semiconductor stack.

Although the LED and the method of fabricating the same have been described above, they are not limited to only the LED, but may be applied to other nitride-base semiconductor devices.

According to a further aspect of the present invention, there is provided a method of fabricating a semiconductor device, including: preparing a support substrate; forming nano-rods on one surface of the support substrate; and forming a seed layer on the nano-rods.

The step of forming the seed layer may include forming the seed layer on the nano-rods using a chemical vapor deposition (CVD) or hydride vapor phase epitaxy (HYPE) technique.

The step of forming the seed layer may include preparing a bulk substrate; joining the bulk substrate on one surface of the support substrate; and cutting the bulk substrate to a predetermined thickness from the juncture and separating it to form the seed layer.

The bulk substrate may be fabricated using an HYPE, Na flux or ammonothermal technique.

The seed layer may include GaN.

The nano-rods may include AlN or GaN.

The support substrate may be a Si substrate, sapphire substrate, AlN substrate, Ge substrate or SiC substrate.

The support substrate may have a concavo-convex pattern formed on one surface thereof.

The method may further include: after forming the seed layer, forming a plurality of semiconductor layers including at least a first conductive semiconductor layer, an active layer and a second conductive semiconductor layer on the seed layer; forming a semiconductor stack in which a portion of the first conductive semiconductor layer is exposed by patterning the semiconductor layers; forming a transparent conductive oxide (TCO) layer on the second conductive semiconductor layer of the semiconductor stack; and forming first and second electrodes on the exposed first conductive semiconductor layer and the TCO layer, respectively.

The method may further include planarizing a surface of the seed layer before forming the plurality of semiconductor layers.

The TCO layer may include a concavo-convex pattern on a surface thereof.

The step of forming the TCO layer on the second conductive semiconductor layer may include forming a first TCO layer on the semiconductor stack; forming a photoresist pattern on the first TCO layer; forming a second TCO layer on the first TCO layer having the photoresist pattern formed thereon; and removing portions of the photoresist pattern and the second TCO layer formed on the photoresist pattern using a lift-off technique.

The step of forming the TCO layer on the second conductive semiconductor layer may include forming a photoresist pattern having a plurality of open regions on the TCO layer; and forming a concavo-convex pattern on the surface of the TCO layer by wet-etching the surface of the TCO layer to a predetermined depth using the photoresist pattern as a mask.

The method may further include: after forming the seed layer, forming a plurality of semiconductor layers including at least a first conductive semiconductor layer, an active layer and a second conductive semiconductor layer on the seed layer; forming an etch stop pattern on the second conductive semiconductor layer of the plurality of semiconductor layers; forming a metal bonding layer on the seed layer having the etch stop pattern formed thereon; forming a metal substrate on the metal bonding layer; separating the support substrate; forming a semiconductor stack by patterning the plurality of semiconductor layers; forming a TCO layer on an surface exposed by separating the support substrate; and forming an electrode pad on the TCO layer.

The step of separating the support substrate may comprise a step of destroying the nano-rods by applying a thermal impact to the nano-rods.

The method may further include removing the seed layer before forming the TCO layer after separating the support substrate.

The method may further include forming an ohmic reflective pattern between the plurality of semiconductor layers and the metal bonding layer before forming the metal bonding layer after forming the plurality of semiconductor layers.

The ohmic reflective pattern may be provided to be filled in the open regions of the etch stop pattern.

The method may further include planarizing a surface of the seed layer before forming the plurality of semiconductor layers.

The TCO layer may include a concavo-convex pattern formed on a surface thereof.

The step of forming the TCO layer on the surface from which the support substrate has been separated may include forming a first TCO layer on the surface from which the support substrate has been separated; forming a photoresist pattern on the first TCO layer; forming a second TCO layer on the first TCO layer having the photoresist pattern formed thereon; and removing portions of the photoresist pattern and the second TCO layer formed on the photoresist pattern using a lift-off technique.

The step of forming the TCO layer on the surface from which the support substrate has been separated may include forming a photoresist pattern having a plurality of open regions on the surface from which the support substrate has been separated; and forming a concavo-convex pattern on a surface of the TCO layer by wet-etching the surface of the TCO layer to a predetermined depth using the photoresist pattern as a mask.

According to a still further aspect of the present invention, there is provided a method of fabricating a semiconductor device, including: simultaneously loading a plurality of substrates in a horizontal direction into a semiconductor device fabricating apparatus; processing the plurality of substrates; and simultaneously unloading the plurality of substrates from the semiconductor device fabricating apparatus.

The plurality of substrates may be mounted on a jig. Thus, the plurality of substrates can be loaded or unloaded by loading or unloading the jig into or from the semiconductor device fabricating apparatus.

The jig may have a plurality of substrate mounting recesses in which the plurality of substrates are mounted and fixed, respectively.

The jig may have a plurality of through-holes that pass through the jig. The through-hole may be provided in the bottom of each of the substrate mounting recesses.

The method may further include mounting, on the jig, a jig cover having a plurality of open regions for exposing surfaces of the plurality of substrates before processing the plurality of substrates loaded into the semiconductor device fabricating apparatus.

The jig may be mounted in a cassette before the jig is loaded into the semiconductor device fabricating apparatus or after the jig is unloaded from the semiconductor device fabricating apparatus.

The cassette may have a plurality of jigs mounted in layers.

When the cassette is separated and transferred from the semiconductor device fabricating apparatus, the cassette may be transferred in a state where the cassette is inserted into a nitrogen-charged box.

The jig may be made of a material including Si, SiC or $Al_2O_3$.

According to embodiments of the present invention, it is possible to provide a light emitting diode (LED) including an active layer that is a non-polar or semi-polar semiconductor layer. Thus, polarization can be reduced or removed, thereby improving light emitting efficiency. Further, semiconductor layers may be grown using a miscut GaN substrate, so that the semi-polar semiconductor layer can be relatively easily grown. In addition, the GaN substrate may be separated by means of an electrochemical etching technique, so that it is possible to reuse the GaN substrate, thereby saving the fabrication cost.

Further, it is possible to provide a semiconductor device substrate having a seed layer which has a material, lattice constant or thermal expansion coefficient identical or similar to that of a semiconductor layer to be grown thereon, and it is possible to provide a method of fabricating a semiconductor device using the semiconductor device substrate.

Furthermore, it is possible to provide a method of fabricating a semiconductor device, which can reduce time required to load a plurality of substrates into a semiconductor device fabricating apparatus.

BRIEF DESCRIPTION OF DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
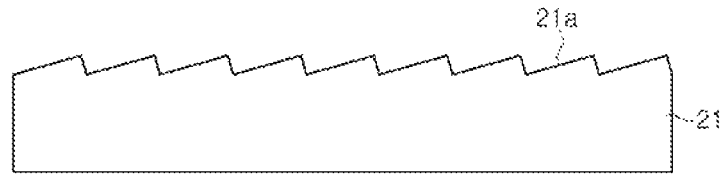
FIG. 1 is a sectional view illustrating a miscut gallium nitride (GaN) substrate.

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements are exaggerated for convenience of illustration. Like reference numerals indicate like elements throughout the specification and drawings.

FIG. 1 is a sectional view illustrating a miscut gallium nitride (GaN) substrate which may be used as a growth substrate in embodiments of the present invention.

Referring to FIG. 1, the substrate 21 is a semi-polar GaN substrate with a principal surface inclined at a degree ranging from 15 to 85 degrees with respect to c-axis. The substrate 21 also has miscut surfaces 21a inclined in one direction with respect to the principal surface.

A kink is formed by forming the miscut surfaces 21a. The kink provides nuclear generation sites in the growth of a GaN-based semiconductor layer so that the semiconductor layer can be easily grown. The miscut surfaces 21a may be c-plane, but not particularly limited thereto.

The principal surface of the substrate 21 may be a semi-polar surface such as (20-21), (20-2-1), (10-11), (10-1-1), (11-22), (11-2-2), (30-31) or (30-3-1), or a family thereof.

By growing GaN-based semiconductor layers on the substrate 21, it is possible to grow semiconductor layers having semi-polar surfaces identical to that of the substrate 21. Particularly, since spontaneous polarization and piezoelectric polarization of the GaN-based semiconductor layers are relatively smaller than those of a polar semiconductor layer, light emitting efficiency can be improved.

Figure 2:
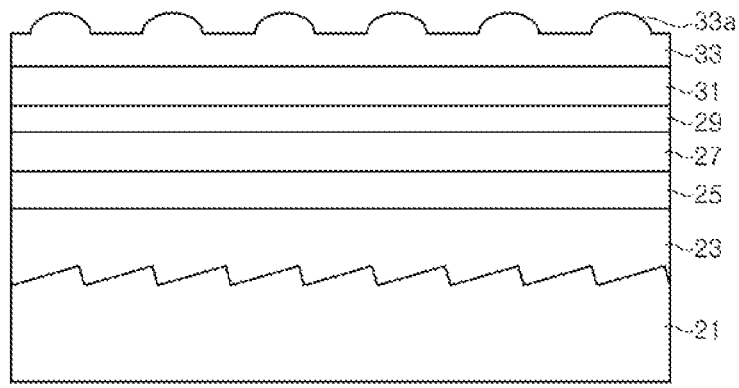
FIG. 2 is a sectional view illustrating a light emitting diode (LED) according to an embodiment of the present invention.

FIG. 2 is a sectional view illustrating a light emitting diode (LED) according to an embodiment of the present invention.

Referring to FIG. 2, the LED includes a substrate 21, a buffer layer 23, a first conductive semiconductor layer 25, a superlattice layer 27, an active layer 29, a second conductive semiconductor layer 31 and a transparent oxide layer 33. The LED may further include an electrode pad (not shown) on the transparent oxide layer 33.

The substrate 21 is a substrate described with reference to FIG. 1, and therefore, the detailed description of the substrate 21 will be omitted. Here, the substrate 21 is a conductive substrate so that the substrate 21 may be used as an electrode. Alternatively, an electrode may be formed on a lower side of the substrate 21.

The buffer layer 23, the first conductive semiconductor layer 25, the superlattice layer 27, the active layer 29, and the second conductive semiconductor layer 31 are grown as epitaxial layers on the substrate 21.

The epitaxial layers, particularly the active layer 29 may be grown as a semi-polar semiconductor layer by being grown on the semi-polar substrate 21. Thus, the polarization of the active layer 29 is relatively smaller than that of the polar semiconductor layer.

The buffer layer 23 is formed to improve crystallinity by reducing strain in an epitaxial layer grown on the substrate 21. The buffer layer 23 may be a GaN layer having the same composition as that of the substrate but is not necessarily limited thereto. The buffer layer 23 may be omitted.

The first conductive semiconductor layer 25 may be grown as, for example, a GaN layer doped with an n-type impurity. The superlattice layer 27 may be formed by alternately stacking GaN-based layers having different bandgaps, e.g., a GaN layer and an InGaN layer.

The active layer 29 includes a well layer having a relatively narrow bandgap so that electrons and holes can be recombined therein. The active layer 29 may have a single or multiple quantum well structure.

The second conductive semiconductor layer 31 may be grown as, for example, a GaN layer doped with a p-type impurity. Further, the second conductive semiconductor layer 31 may include an electron blocking layer.

The epitaxial layers may be grown using a molecular beam epitaxy (MBE) or metal oxide chemical vapor deposition (MOCVD) technique.

The transparent oxide layer 33 is positioned on a semiconductor stack including the first conductive semiconductor layer 25, the active layer 29 and the second conductive semiconductor layer 31. The transparent oxide layer 33 is formed for electrical current spreading. The transparent oxide layer 33 may have a concavo-convex pattern 33a on an upper surface thereof. In order to realize the electrical current spreading and to form the concavo-convex pattern 33a, the entire thickness of the transparent oxide layer 33 may be about 1 μm or more, and the thickness of a main portion of the transparent oxide layer 33 may be 0.5 μm or more.

The transparent oxide layer 33 may be formed of indium tin oxide (ITO) or zinc oxide (ZnO). For example, the transparent oxide layer 33 having the concavo-convex pattern may be formed by primarily forming a portion of the transparent oxide layer and then forming convex portions through a lift-off process.

The transparent oxide layer 33 having the concavo-convex pattern 33a enhances light extraction efficiency of light generated in the active layer 29, thereby improving light emitting efficiency of the LED.

Figure 3:
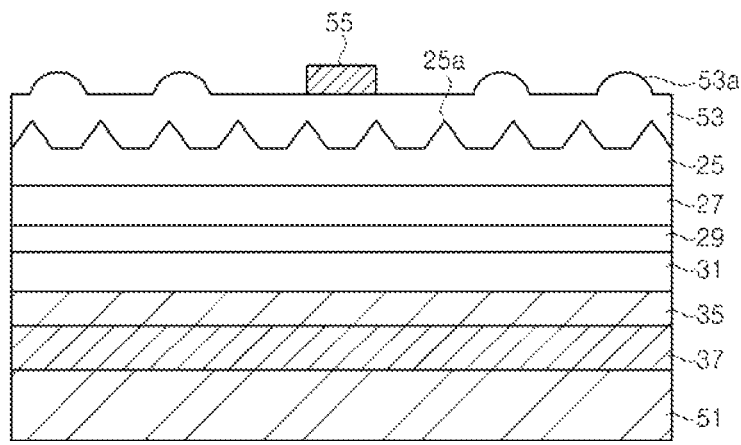
FIG. 3 is a sectional view illustrating an LED according to another embodiment of the present invention.

FIG. 3 is a sectional view illustrating an LED according to another embodiment of the present invention.

Referring to FIG. 3, the LED according to this embodiment includes a substrate 51, a bonding metal 37, a reflective layer 35, a first conductive semiconductor layer 25, a superlattice layer 27, an active layer 29, a second conductive semiconductor layer 31 and a transparent oxide layer 33. The LED may further include an electrode pad 55 formed on the transparent oxide layer 53.

The substrate 51 is a conductive substrate, e.g., a metal substrate. The substrate 51 is distinguished from a growth substrate, and is a secondary substrate attached on a semiconductor stack which has already been grown.

The bonding metal 37 is used to couple the substrate 51 and the semiconductor stack to each other, and may be, for example, AuSn. The reflective layer 35 may be formed to reflect light that is emitted from the active layer 29 and travels toward the substrate 51, and may be formed of Ag and include a barrier metal layer for preventing diffusion of Ag.

Meanwhile, the first conductive semiconductor layer 25, the superlattice layer 27, the active layer 29 and the second conductive semiconductor layer 31 are the same components as the respective layers of the semiconductor stack described with reference to FIG. 2, and are designated by like reference numerals. Thus, each layer, particularly the active layer 29 is formed as a semi-polar semiconductor layer. However, in this embodiment, the semiconductor stack has an inverted structure as compared with the embodiment of FIG. 2. The first conductive semiconductor layer 25 may have a concavo-convex pattern 25a on an upper surface thereof.

The transparent oxide layer 53 is positioned on the first conductive semiconductor layer 25, and may have a concavo-convex pattern 53a. The transparent oxide layer 53 is similar to the transparent oxide layer 33 described above, and therefore, the detailed description of the transparent oxide layer 53 will be omitted.

The electrode pad 55 is positioned on the transparent oxide layer 53. The electrode pad 55 is generally provided to bond a bonding wire thereto.

Figure 4:
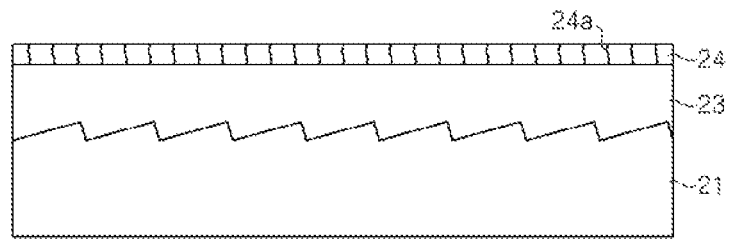
FIGS. 4 to 6 are sectional views illustrating a method of fabricating the LED shown in FIG. 3.
Figure 5:
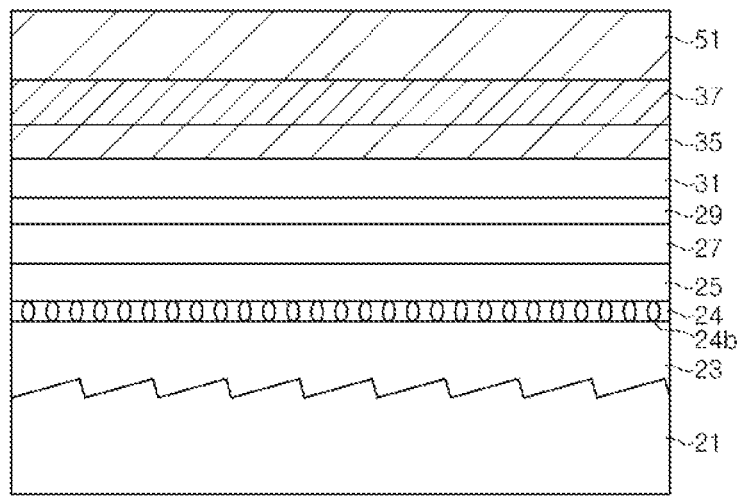
Figure 6:
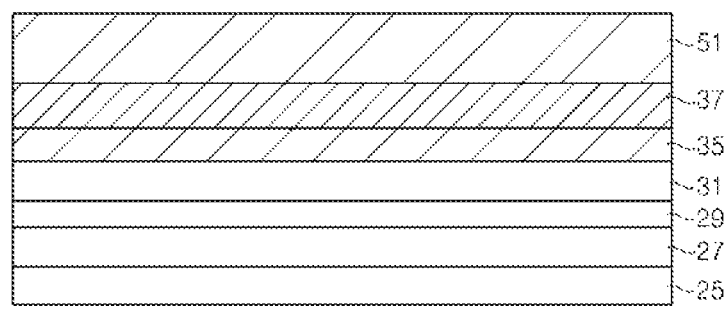

FIGS. 4 to 6 are sectional views illustrating a method of fabricating the LED of FIG. 3.

Referring to FIG. 4, a miscut semi-polar GaN substrate 21 having a principal surface inclined at an angle ranging from 15 to 85 degrees with respect to c-plane is first prepared. The substrate 21 is the same as the substrate 21 described with reference to FIG. 1, and therefore, the detailed description of the substrate 21 will be omitted.

A buffer layer 23 is grown on the substrate 21. The buffer layer 23 may be gown as a nitride layer undoped with impurities, e.g., a GaN layer. Here, the buffer layer 23 is used as a layer for growing an epitaxial layer thereon, and is also required to separate the substrate 21 therefrom.

A nitride layer 24 having a porous structure with pores 24a is formed on the buffer layer 23. For example, the nitride layer 24 having the porous structure may be formed by growing a GaN layer doped with Si at a concentration ranging from $1 \times 10^{18}/cm^3$ to $10 \times 10^{19}/cm^3$ and then etching the GaN layer through electrochemical etching. The electrochemical etching may be performed by immersing the substrate 21 having the nitride layer doped with the impurity and a Pt electrode in, for example, an oxalic acid solution (0.3M oxalic acid) at about 10° C.; and connecting positive and negative electrodes to the nitride layer and the Pt electrode, respectively, to apply a DC voltage (25-60V) thereto.

The porous structure, as shown in FIG. 4, may have nanoscale rod-shaped pores 24a that extend from the surface of the nitride layer 24 to the buffer layer 23.

Referring to FIG. 5, a semiconductor stack is formed by growing epitaxial layers, e.g., a first conductive semiconductor layer 25, a superlattice layer 27, an active layer 29 and a second conductive semiconductor layer 31, on the nitride layer 24 with the porous structure. These epitaxial layers are the same as those described with reference to FIG. 2, and therefore, their detailed descriptions will be omitted.

Meanwhile, while the epitaxial layers are grown at a relatively high temperature, the pores 24a are also grown, resulting in voids 24b formed within the nitride layer 24. In addition, a thermal process at about 1000° C. may be additionally performed to further increase the size of the voids 24b within the nitride layer 24.

Subsequently, a reflective layer 35 is formed on the semiconductor stack. The reflective layer 35 may be formed of a reflective metal such as Ag, and may include a barrier metal layer for preventing Ag from being diffused. Then, a substrate 51 is attached on the reflective layer 35 with a bonding metal 37 interposed therebetween. The bonding metal 37 may be, for example, AuSn, and the substrate 51 may be a metal substrate.

Referring to FIG. 6, after the substrate 51 is attached, the semi-polar GaN substrate 21 is removed using the nitride layer 24 with the voids 24b formed therein. For example, the semi-polar GaN substrate 21 may be separated by etching the nitride layer 24 using a chemical etching technique. Alternatively, the semi-polar GaN substrate 21 may be separated by applying a mechanical force thereto.

Then, a concavo-convex pattern (25a of FIG. 3) may be formed by patterning an exposed surface of the semiconductor stack, e.g., a surface of the first conductive semiconductor layer 25. The exposed surface of the semiconductor stack has a relatively rough surface due to the voids 24b. The concavo-convex pattern 25a may be formed using a dry etch after chemically etching or mechanically polishing an upper portion having the rough surface. Alternatively, the concavo-convex pattern 25a may be additionally formed while the rough surface remains.

Then, a transparent oxide layer 53 is formed on the first conductive semiconductor layer 25. The transparent oxide layer 53 may be formed to have a concavo-convex pattern 53a as described with reference to FIG. 2, and its detailed description will be omitted.

Subsequently, an electrode pad 55 is formed on the transparent oxide layer 53, and accordingly, an LED with a vertical structure is provided.

Figure 7:
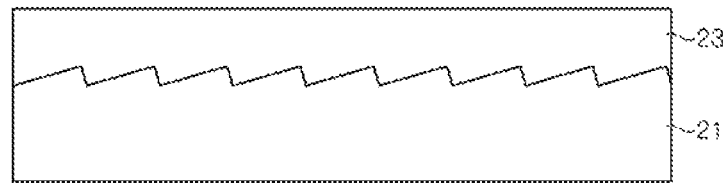
FIG. 7 is a sectional view illustrating a separated GaN substrate.

FIG. 7 is a sectional view illustrating the semi-polar GaN substrate separated from FIG. 6.

Referring to FIG. 7, the semi-polar GaN substrate 21 together with the buffer layer 23 is separated from the semiconductor stack. The semi-polar GaN substrate 21 maintains its original configuration, and thus, can be reused as a growth substrate by being miscut again.

As the semi-polar GaN substrate 21 is reused, the fabrication cost of the semi-polar GaN substrate 21 may be reduced, and accordingly, the fabrication cost of the LED may be reduced.

Figure 8:
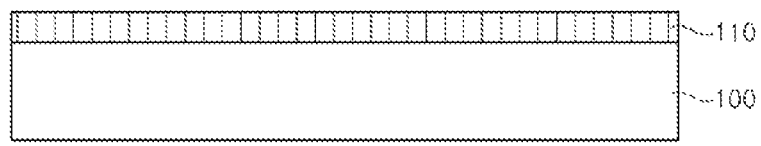
FIGS. 8 and 9 are sectional views illustrating a method of fabricating a semiconductor device according to another embodiment of the present invention.
Figure 9:
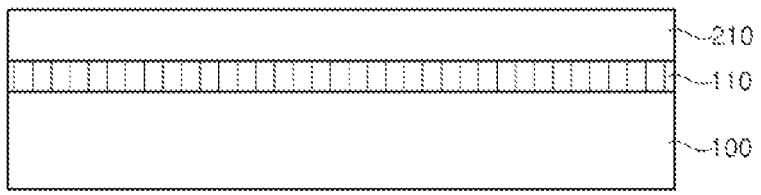
Figure 10:
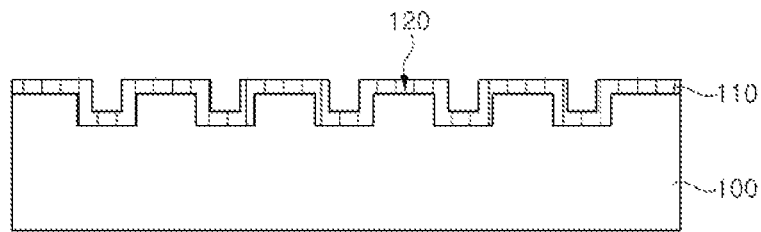
FIG. 10 is a sectional view illustrating another type of support substrate which may be used in the method of fabricating the semiconductor device according to the present invention.
Figure 11:
FIGS. 11 to 13 are sectional views illustrating a method of forming a seed layer used in the method of fabricating the semiconductor device according to the present invention.
Figure 12:
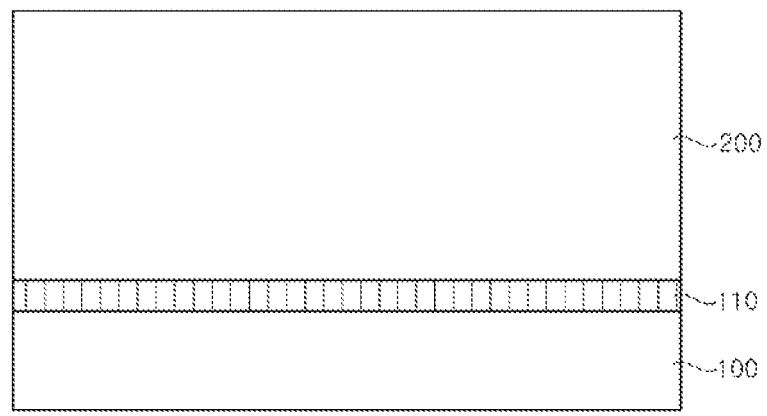
Figure 13:
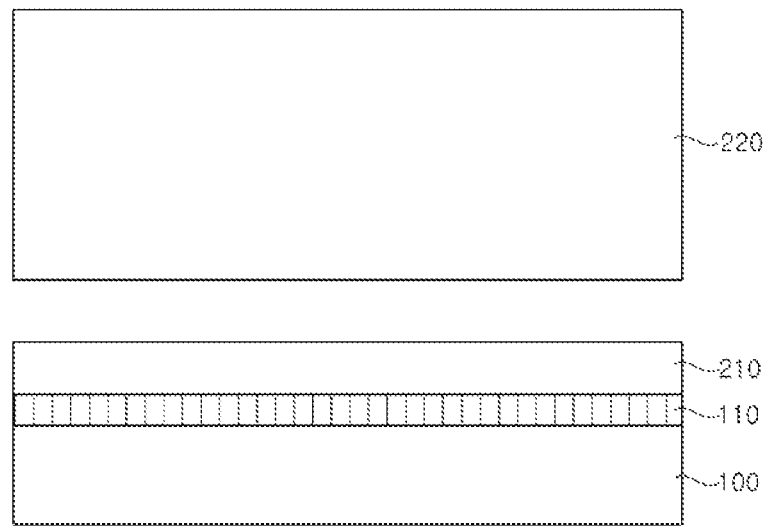

FIGS. 8 and 9 are sectional views illustrating a method of fabricating a semiconductor device according to another embodiment of the present invention. FIG. 10 is a sectional view illustrating another type of support substrate which may be used in the method of fabricating the semiconductor device according to the present invention. FIGS. 11 to 13 are sectional views illustrating a method of forming a seed layer used in the method of fabricating the semiconductor device according to the present invention.

Referring to FIG. 8, method according to this embodiment includes first preparing a support substrate 100. The support substrate 100 may be any substrate on which nano-rods 110 as will be described later can be grown. However, the support substrate 100 may be preferably a Si substrate, sapphire substrate, AlN substrate, Ge substrate or SiC substrate.

The nano-rods 110 are formed on one surface of the support substrate 100. The nano-rods 100 may include AlN or GaN. The nano-rods 110 may be grown on the support substrate 100 using an epitaxial growth technique. Alternatively, the nano-rods 110 may be formed by forming a nitride layer of AlN or GaN and then patterning the nitride layer.

At this time, the support substrate 100 may have a concavo-convex pattern 120 on the one surface thereof as shown in FIG. 10. The concavo-convex pattern 120 may be formed in a stripe shape.

The concavo-convex pattern 120 may serve to grow a seed layer 210, which will be described later, on the support substrate 100 or to alleviate stress that might be generated after bonding of a bulk substrate 200 thereto as will be described later.

Referring to FIG. 9, the seed layer 210 is formed on the nano-rods 210. The seed layer 210 may include GaN, and may be a p-type or n-type GaN single crystal layer doped with impurities.

The seed layer 210 may be formed directly on the nano-rods 110 using a chemical vapor deposition (CVD) or hydride vapor phase epitaxy (HYPE) technique.

Alternatively, as shown in FIGS. 11 to 13, the seed layer 210 may be formed by preparing the bulk substrate 200 (see FIG. 11), joining the bulk substrate 200 on the nano-rods 110 (see FIG. 12), and then cutting the bulk substrate 200 to a predetermined thickness and separating it (see FIG. 13).

At this time, the bulk substrate 200 may be a single crystal substrate made of an (Al, Ga, In)N based Group III nitride semiconductor, i.e., a nitride semiconductor. The bulk substrate 200 may include GaN, and preferably, may be a GaN single crystal substrate. Alternatively, the bulk substrate 200 may be a p-type or n-type GaN single crystal substrate doped with impurities.

The bulk substrate 200 may be a GaN single crystal substrate fabricated using an HYPE technique, Na flux technique, or ammonothermal technique. The bulk substrate 200 has a thickness of at least 100 μm or more.

At this time, the support substrate 100 and the bulk substrate 200 may be joined to each other under high temperature and high pressure. Although not shown in this Figure, a joining layer (not shown) or metallic intermediate layer (not shown) may be positioned between the nano-rods 110 and the bulk substrate 200 so as to facilitate the joining between the support substrate 100 and the bulk substrate 200. The joining layer (not shown) or the metallic intermediate layer (not shown) may be formed on the nano-rods 110 or may be formed on a surface of the bulk substrate 200.

The joining layer (not shown) may be made of an oxide including at least one of Zn, Si, Ga and Al, or a nitride including at least one of Si, Ga and Al. The joining layer (not shown) may be formed as a single layer or multilayer, using a CVD technique, electron-beam (E-beam) technique, chemical solution technique, or the like. In a case where the joining layer is formed as a multilayer, respective sub-layers of the multilayer may be made of the same kind of material but have different compositions. Alternatively, the sub-layers may be made of different kinds of materials. The metallic intermediate layer (not shown) may include a material having a melting point of 1000° C. or more.

The bulk substrate 200 may be cut and separated at a region corresponding to a predetermined thickness from the nanorods 110. The seed layer 210 is formed by cutting the bulk substrate 200 to the predetermined thickness and separating it. If the process described above is repeated using the separated bulk substrate 220, a plurality of support substrates 100 each of which has the seed layer 210 attached thereto may be formed.

Through the process described above, a semiconductor device substrate capable of allowing formation of a semiconductor device can be formed. In this case, the seed layer 210 may be non-polar or semi-polar. Particularly, the seed layer 210 may be provided as an expensive non-polar or semi-polar layer, regardless of the support substrate 100. That is, since the seed layer 210 is formed by being cut and separated from the bulk substrate 200, the seed layer 210 can be obtained with a desired configuration by controlling the direction in which the bulk substrate 200 is grown or cut.

Figure 14:
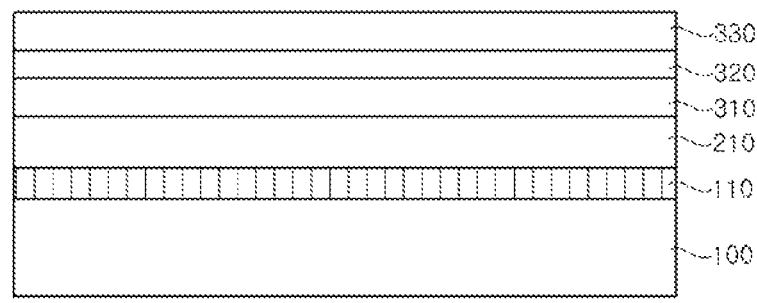
FIGS. 14 and 15 are sectional views illustrating a method of fabricating a semiconductor device according to another embodiment of the present invention.
Figure 15:
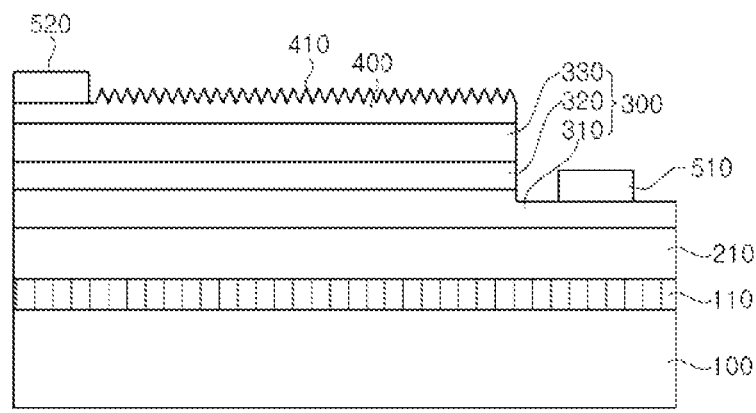

FIGS. 14 and 15 are sectional views illustrating a method of fabricating a semiconductor device according to another embodiment of the present invention.

Referring to FIG. 14, the method according to this embodiment, e.g., a method of fabricating an LED device, includes first forming a semiconductor device substrate having a seed layer 210 formed on a support substrate 100, as described with reference to FIGS. 8 and 9.

Subsequently, a process of planarizing one surface of the separated seed layer 210 may be performed. This is because the one surface of the seed layer 210 may be a very rough separated surface if the seed layer 210 is cut and separated from the bulk substrate 200. It will be apparent that the planarization process may be omitted if the seed layer 210 is formed through a growth technique or if the one surface of the seed layer 210 is not rough. Alternatively, the planarization process may be omitted as requested.

Then, a plurality of semiconductor layers including at least a first conductive semiconductor layer 310, an active layer 320 and a second conductive semiconductor layer 330 are formed on the seed layer 210 of the semiconductor device substrate.

The plurality of semiconductor layers may further include a superlattice layer (not shown) or an electron blocking layer (not shown). In this case, the other layers except for the active layer 320 may be omitted in the plurality of semiconductor layers.

The first conductive semiconductor layer 310 may be a Group III-N based compound semiconductor layer doped with a first conducive impurity, e.g., an n-type impurity. For example, the first conductive semiconductor layer 310 may be an (Al, Ga, In)N based Group III nitride semiconductor layer. The first conductive semiconductor layer 310 may be a GaN layer doped with an n-type impurity, i.e., an n-GaN layer. The first conductive semiconductor layer 310 may be formed as a single layer or multilayer. For example, when the first conductive semiconductor layer 310 is formed as a multilayer, the first conductive semiconductor layer 310 may be made to have a superlattice structure.

The active layer 320 may be a Group III-N based compound semiconductor layer, e.g., an (Al, Ga, In)N semiconductor layer. The active layer 320 may be formed as a single layer or multilayer and emit light of at least a predetermined wavelength. The active layer 320 may have a single quantum well structure including one well layer (not shown), or may have a multiple quantum well structure in which well layers (not shown) and barrier layers (not shown) are alternately and repetitively stacked. At this time, one or both of the well layers (not shown) and the barrier layers (not show) may be made to have a superlattice structure.

The second conductive semiconductor layer 330 may be a Group III-N based compound semiconductor layer doped with a second conductive impurity, e.g., a p-type impurity. For example, the second conductive semiconductor layer 330 may be an (Al, Ga, In)N based Group III nitride semiconductor layer. The second conductive semiconductor layer 330 may be a GaN layer doped with a p-type impurity, i.e., a p-GaN layer. The second conductive semiconductor layer 330 may be formed as a single layer or multilayer. For example, the second conductive semiconductor layer 330 may include a superlattice structure.

The superlattice layer (not shown) may be provided between the first conductive semiconductor layer 310 and the active layer 320. The superlattice layer (not shown) may have a structure in which a plurality of Group III-N based compound semiconductor layers, e.g., (Al, Ga, In)N semiconductor layers are stacked. For example, the superlattice layer (not shown) may have a structure in which InN layers and InGaN layers are repetitively stacked. The superlattice layer (not shown) is formed before the active layer 320 is formed, so that a dislocation or defect is prevented from being transferred to the active layer 320. Thus, the superlattice layer (not shown) can serve to reduce the formation of the dislocation or defect in the active layer 320 and to allow the active layer 320 to have excellent crystallinity.

The electron blocking layer (not shown) may be provided between the active layer 320 and the second conductive semiconductor layer 330. The electron blocking layer (not shown) may be provided to improve recombination efficiency of electrons and holes. The electron blocking layer (not shown) may be made of a material having a relatively wide bandgap. The electron blocking layer (not shown) may be made of an (Al, In, Ga)N based Group III nitride semiconductor, and may be a p-AlGaN layer doped with Mg.

In this case, the plurality of semiconductor layers are grown from the seed layer 210, so that the semiconductor layers can be grown while taking over intact characteristics of the seed layer 210.

That is, if the seed layer 210 is non-polar, the plurality of semiconductor layers are also grown to be non-polar. Alternatively, if the seed layer 210 is semi-polar, the plurality of semiconductor layers are also grown to be semi-polar. If the seed layer 210 is a c-plane, a-plane or m-plane semiconductor layer, the plurality of semiconductor layers are also grown to be c-plane, a-plane or m-plane semiconductor layers.

Referring to FIG. 15, the plurality of semiconductor layers are patterned to form a semiconductor stack 300 in which a portion of the first conductive semiconductor layer 310 is exposed.

Subsequently, a transparent conductive oxide (TCO) layer 400 is formed on the second conductive semiconductor layer 330 of the semiconductor stack 300.

Then, a first electrode 510 is formed on the exposed first conductive semiconductor layer 310, and a second electrode 520 is formed on the TCO layer 400, thereby fabricating an LED device.

In this case, although it has been described that the TCO layer 400 is formed after the semiconductor stack 300 is formed, it is possible to perform a process of forming the semiconductor stack 300 by first forming the TCO layer 400 and then exposing a portion of the first conductive semiconductor layer 310 through etching of a portion of the TCO layer 400 and a portion of the plurality of semiconductor layers.

The TCO layer 400 may include a transparent metal oxide such as ITO or ZnO, and the thickness of the TCO layer 400 may be a few to a few tens of micrometers (m). In this case, the TCO layer 400 may have concavo-convex portions 410 formed on a surface thereof. The TCO layer 400 having the concavo-convex portions 410 formed on the surface thereof may be formed using methods shown in FIGS. 16 and 17.

Figure 16:
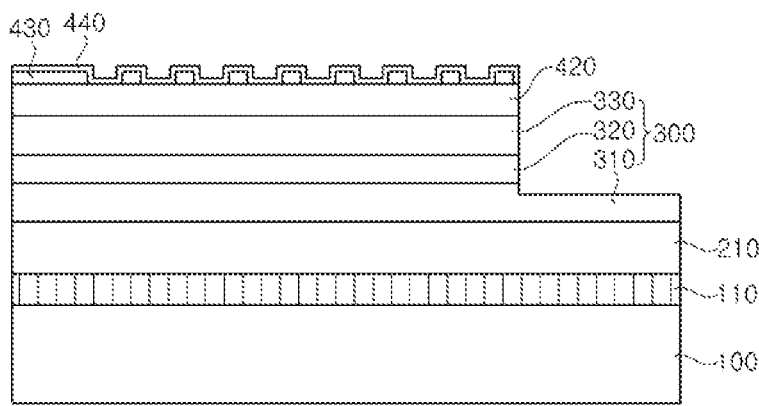
FIGS. 16 and 17 are sectional views illustrating a method of forming a concavo-convex pattern on a surface of a transparent conductive oxide (TCO) layer.

That is, as shown in FIG. 16, a first TCO layer 420 with a predetermined thickness is formed on the semiconductor stack 300, and a photoresist pattern 430 is formed on the first TCO layer 420. Subsequently, a second TCO layer 440 with a predetermined thickness is formed on the first TCO layer 420 having the photoresist pattern 430 formed thereon, and portions of the photoresist pattern 430 and the second TCO layer 440 formed on the photoresist pattern 430 are removed using a lift-off technique, thereby forming the TCO layer 400 having the concavo-convex portions 410 formed on the surface thereof.

Figure 17:
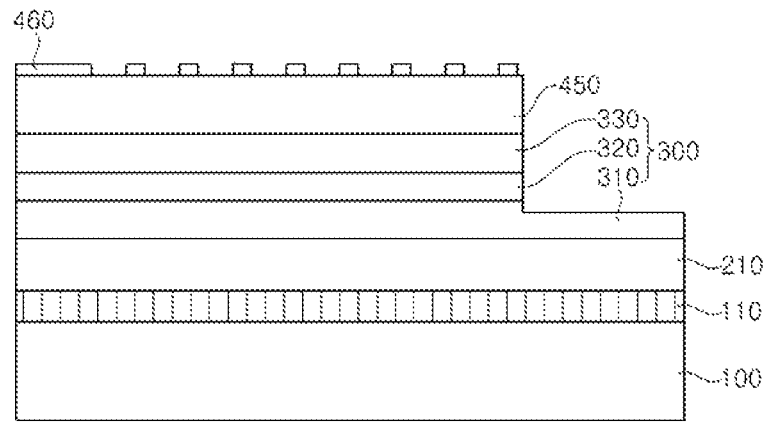

As shown in FIG. 17, a third TCO layer 450 with a predetermined thickness is formed on the semiconductor stack 300, and a photoresist pattern 460 is formed on the third TCO layer 450. Subsequently, a surface of the third TCO layer 450 is wet-etched to a predetermined depth using the photoresist pattern 460 as a mask, thereby forming the TCO layer 400 having the concavo-convex portions 410 formed on the surface thereof. In this case, the wet etching allows the concavo-convex portions 410 to be etched such that crystal faces are exposed by selectively etching the surface of the TCO layer 400 along the crystal faces. Therefore, the concavo-convex portions 410 may be formed to have a polypyramid in shape.

Figure 18:
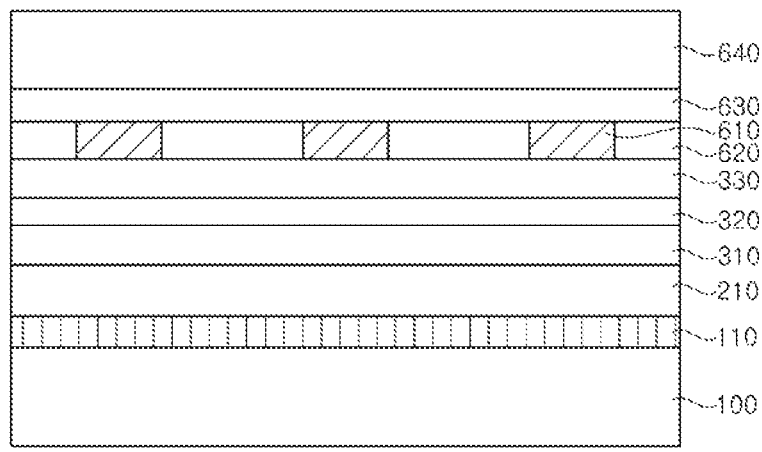
FIGS. 18 and 19 are sectional views illustrating a method of fabricating a semiconductor device according to a further embodiment of the present invention.
Figure 19:
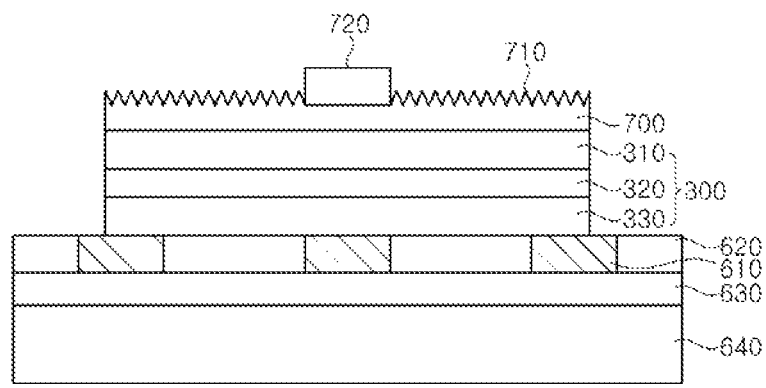

FIGS. 18 and 19 are sectional views illustrating a method of fabricating a semiconductor device according to a further embodiment of the present invention.

Referring to FIG. 18, the method according to this embodiment, e.g., a method of fabricating an LED device, includes first forming a semiconductor device substrate having a seed layer 210 formed on a support substrate 100, as described with reference to FIGS. 8 and 9.

Subsequently, similarly to the method described with reference to FIG. 14, a process of planarizing one surface of the separated seed layer 210 is performed, and a plurality of semiconductor layers including at least a first conductive semiconductor layer 310, an active layer 320 and a second conductive semiconductor layer 330 are formed on the seed layer 210 of the semiconductor device substrate. In this case, the plurality of semiconductor layers may further include a superlattice layer (not shown) or an electron blocking layer (not shown). The other layers except for the active layer 320 may be omitted in the plurality of semiconductor layers.

Subsequently, an etch stop pattern 610 is formed on the second conductive semiconductor layer 330. The etch stop pattern 610 may be formed as an insulation layer such as silicon oxide or silicon nitride. The etch stop pattern 610 may serve to notify when the etching is completed upon patterning the plurality of semiconductor layers. In addition, the etch stop pattern 610 is positioned directly below an electrode pad 720 as will be described later, so that the etch stop pattern 610 may serve to allow an electrical current injected from the electrode pad 720 to be equally spread, thereby causing the electrical current to be generally uniformly supplied to the semiconductor stack 300, particularly the entire active layer 320.

Meanwhile, an ohmic reflective pattern 620 may be formed on the second conductive semiconductor layer 330. The ohmic reflective pattern 620 may be a pattern that is in ohmic contact with the second conductive semiconductor layer 330 and also acts as a reflective layer for reflecting light emitted from the active layer 320.

In this case, the etch stop pattern 610 has open regions, and the ohmic reflective pattern 620 may be filled in the open regions of the etch stop pattern 610. That is, the etch stop pattern 610 and the ohmic reflective pattern 620 may define one layer.

Subsequently, a metal bonding layer 630 may be formed on the etch stop pattern 610 or the ohmic reflective pattern 620. The metal bonding layer 630 serves to bond the etch stop pattern 610 or the ohmic reflective pattern 620 to a metal substrate 640 to be formed later. The metal bonding layer 630 may be made of a conductive material.

Then, the metal substrate 640 is formed thereon. The metal substrate 640 may be formed by preparing a conductive metal substrate and then bonding the conductive metal substrate by using the metal bonding layer 630.

Meanwhile, the metal substrate 640 may be formed directly on the second conductive semiconductor layer 330. That is, any of the etch stop pattern 610, the ohmic reflective pattern 620 and the metal bonding layer 630, which would be formed on the second conductive semiconductor layer 330, is omitted, and the metal substrate 640 may be formed. In this case, the metal substrate 640 may be formed using a plating method, vapor deposition method, chemical solution method or the like.

In this case, the metal substrate 640 may be made of a conductive material, and may preferably include Cu/W or Cu/Mo.

Referring to FIG. 19, after the metal substrate 640 is formed, the support substrate 100 is removed.

The support substrate 100 may be removed by destroying the nano-rods 110. That is, the support substrate 100 may be separated from the plurality of semiconductor layers by applying a thermal impact to the nano-rods 110 to destroy the nano-rods 110.

The method of applying a thermal impact to the nano-rods 110 may be performed by means of a rapid thermal treatment, e.g., by irradiating laser onto the nano-rods 110. The nano-rods 110 are rapidly expanded by the thermal impact and thus can be destroyed by the rapid expansion.

Then, a process of removing the seed layer 210 may be performed. However, a next process may be performed without removing the seed layer 210. If the seed layer 210 is not removed, the next process may be performed after the process of planarizing the surface of the seed layer 210 is performed.

Only a portion of the seed layer 210 may be removed using a wet or dry etching process so that the other portion of the seed layer 210 may remain.

Subsequently, the semiconductor stack 300 may be formed by patterning the plurality of semiconductor layers. In this case, the plurality of semiconductor layers may be etched under the condition that the etching stops when the etch stop pattern 610 is exposed.

Meanwhile, although it has been described in this embodiment that the process of patterning the plurality of semiconductor layers is performed between the process of removing the seed layer 210 and the process of forming a TCO layer 700 as will be described later, the process of patterning the plurality of semiconductor layers may be performed any time before an electrode pad 720, which will be described later, is formed after the support substrate 100 is removed.

Subsequently, the TCO layer 700 may be formed on the surface exposed by separating the support substrate 100, e.g., the surface of the seed layer 210 or the surface of the first conductive semiconductor layer 310.

In this case, the TCO layer 700 may have concavo-convex portions 710 formed on a surface thereof. Here, the concavo-convex portions 710 of the TCO layer 700 may be formed using the same method as the TCO layer 400 having the concavo-convex portions 410 formed on the surface thereof as described with reference to FIGS. 16 and 17, and thus, a detailed description thereof will be omitted.

Subsequently, the electrode pad 720 is formed on the TCO layer 700 to form an LED device.

The method may further include a process of forming a passivation layer (not shown) for protecting the semiconductor stack 300 including the TCO layer 700 before the electrode pad 720 is formed.

In this case, the concavo-convex portions 710 may not be formed in a predetermined region of the TCO layer 700 where the electrode pad 720 is formed. The etch stop pattern 610 may be formed directly below the electrode pad 720.

The size of the electrode pad 720 may be smaller than that of the etch stop pattern 610 positioned directly below the electrode pad 720. That is, the size of the etch stop pattern 610 positioned directly below the electrode pad 720 may be larger than that of the electrode pad 720. This may allow the current supplied to the electrode pad 720 to uniformly flow through the semiconductor stack 300 positioned between the electrode pad 720 and the etch stop pattern 610, particularly through the active layer 320.

Figure 20:
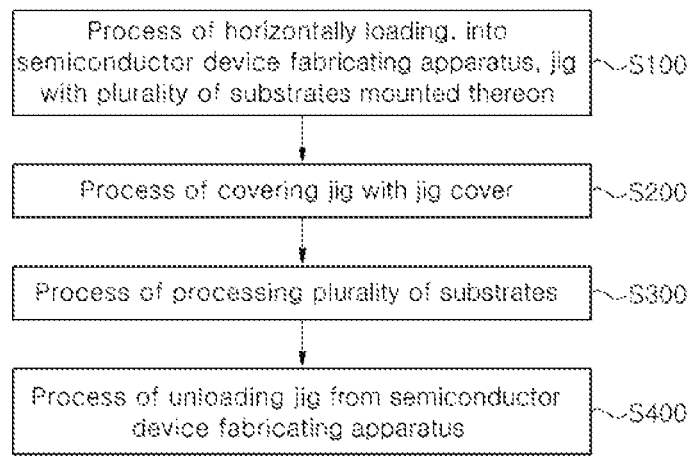
FIG. 20 is a flowchart illustrating a method of fabricating a semiconductor device according to an embodiment of the present invention.
Figure 21:
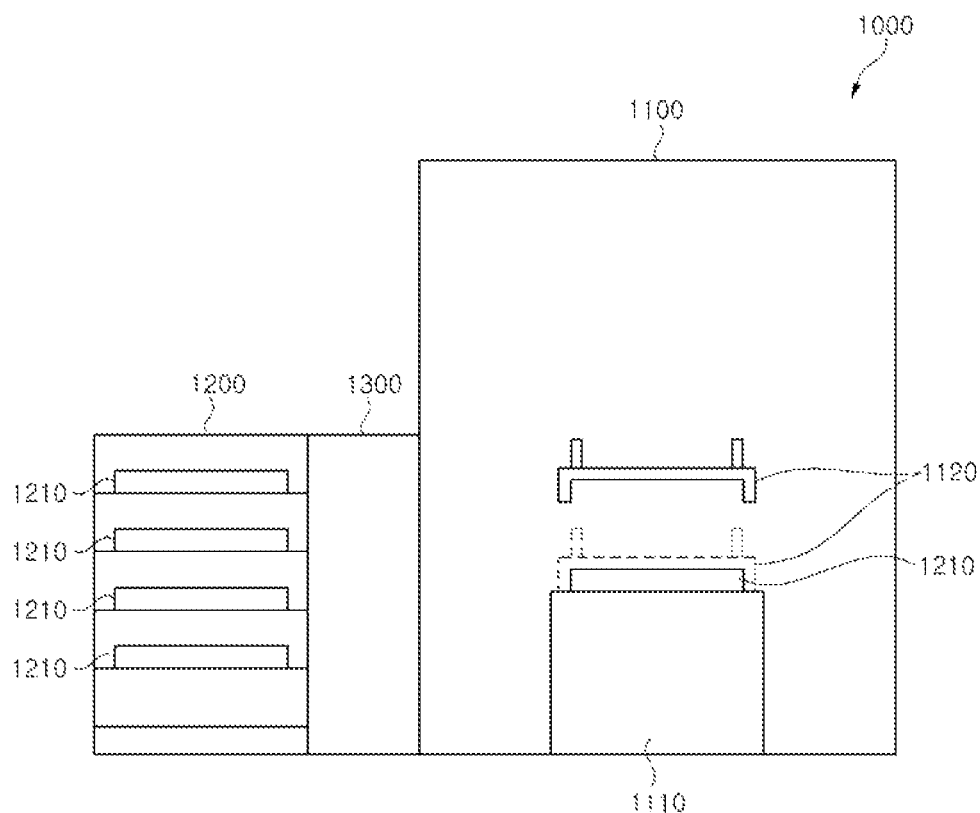
FIG. 21 is a schematic view illustrating a semiconductor device fabricating apparatus which may be used in the method of fabricating the semiconductor device according to the embodiments of the present invention.
Figure 22:
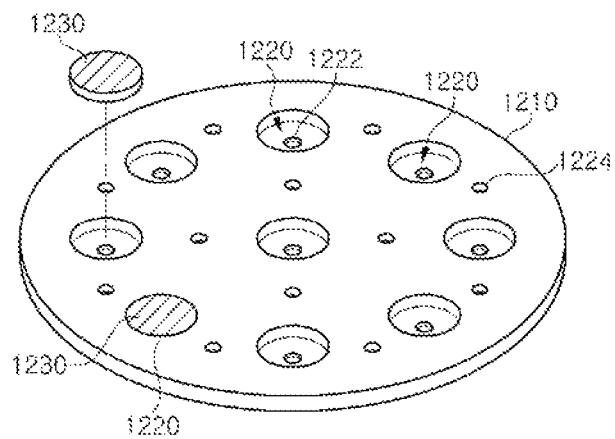
FIG. 22 is a schematic view illustrating a jig which may be used in the methods of fabricating the semiconductor device according to the embodiments of the present invention.
Figure 23:
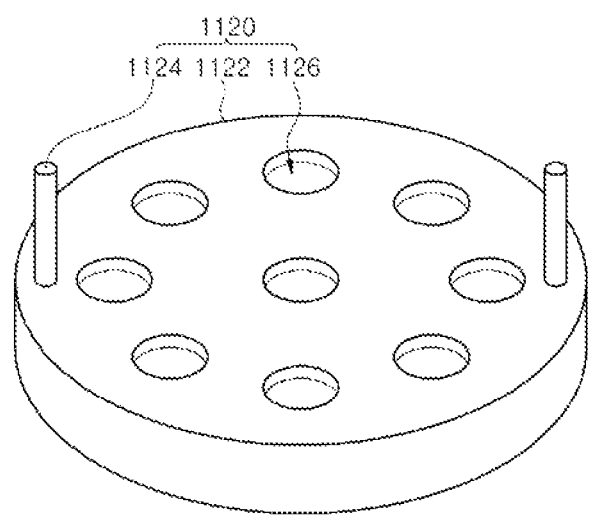
FIG. 23 is a schematic view illustrating a jig cover which may be used in the methods of fabricating the semiconductor device according to the embodiments of the present invention.

FIG. 20 is a flowchart illustrating a method of fabricating a semiconductor device according to an embodiment of the present invention. FIG. 21 is a schematic view illustrating a semiconductor device fabricating apparatus which may be used in the method of fabricating the semiconductor device according to the embodiments of the present invention. FIG. 22 is a schematic view illustrating a jig which may be used in the method of fabricating the semiconductor device according to the embodiments of the present invention. FIG. 23 is a schematic view illustrating a jig cover which may be used in the method of fabricating the semiconductor device according to the embodiments of the present invention.

Referring to FIGS. 20 to 23, the method of fabricating the semiconductor device according to this embodiment includes a process (S100) of horizontally loading, into a semiconductor device fabricating apparatus, a jig 1210 having a plurality of substrates 1230 mounted thereon.

Subsequently, a process (S200) of covering, with a jig cover 1120, the jig 1120 having the plurality of substrates 1230 loaded into the semiconductor device fabricating apparatus is performed.

Then, a process (S300) of processing the plurality of substrates 1230 is performed.

Subsequently, after the process of processing the plurality of substrates 1230 is completed, a process (S400) of unloading the jig 1120 from the semiconductor device fabricating apparatus is performed.

The method of fabricating the semiconductor device is performed using a semiconductor device fabricating apparatus 1000.

In this case, the semiconductor device fabricating apparatus 1000 may be an apparatus, such as an inductively coupled plasma (ICP) apparatus, PECVD apparatus, E-beam apparatus or photolithography apparatus, which performs a process of processing the substrates 1230 as will be described later, including a process of forming a thin film on the substrates 1230, a process of etching the substrates 1230, or the like.

The semiconductor device fabricating apparatus 1000 may include a processing chamber 1100 for processing the substrates 1230, and a loadlock chamber (or transfer chamber) 1300 for loading the jig 1210 into the processing chamber 1100 while preventing the inside of the processing chamber 1100 from being in direct communication with an external environment.

The processing chamber 1100 may include a jig loading chuck 1110 with the jig 1210 sit therein, and the jig cover 1120. In this case, the processing chamber 1100 may further include other components, e.g., a plasma generating apparatus and the like, but descriptions of details thereof will be omitted.

In this case, the jig 1210 may have a plurality of substrate mounting recesses 1220 as shown in FIG. 22.

The substrate mounting recess 1220 may be a recess in which the substrate 1230 is mounted. That is, the substrate mounting recess 1220 may have at least a diameter identical to that of the substrate 1230. The depth of the substrate mounting recess 1220 is preferably identical to the thickness of the substrate 1230. However, the depth of the substrate mounting recess 1220 may be larger or smaller than the thickness of the substrate 1230.

The substrate mounting recesses 1220 may be regularly arranged on a surface of the jig 1210.

The jig 1210 may have a plurality of through-holes 1222 and 1224 through the jig 1210, i.e., passing through the jig 1210 from one surface of the jig 1210 to the other surface of the jig 1210.

In this case, the through-holes 1222 of the through-holes 1222 and 1224 may be provided in bottom surfaces of the substrate mounting recesses 1220 so as to allow the substrates 1230 to be mounted into or separated from the substrate mounting recesses 1220. The other through-holes 1224 may be provided in regions where the substrate mounting recesses 1220 are not provided, so that they can be used to transfer the jig 1210, to load or unload the jig 1210 onto or from the jig loading chuck 1110, or to reduce the weight of the jig 1210.

The through-holes 1222 and 1224 may act as passages that allow an etching solution or gas to smoothly flow when the plurality of substrates 1230 are processed using the etching solution by immersing the jig 1210 with the substrates 1230 mounted thereon in the etching solution, or when the plurality of substrates 1230 are processed using the etching gas.

Although not shown in FIG. 22, the jig 1210 may have a plurality of recesses that do not pass through the other surface of the jig 1210, so that the plurality of recesses may be used to fix or transfer the jig 1210.

The jig 1210 may be made of a material including Si, SiC or $Al_2O_3$.

Meanwhile, the substrate 1230 may be a sapphire substrate. The substrate 1230 may be provided such that an LED is fabricated on one surface thereof.

The jig cover 1120 may include a cover body 1122 and cover rods 1124 for supporting the cover body 1122.

The cover body 1122 may cover the jig 1210 in a manner shown by a dotted line in FIG. 21. The cover body 1122 may have a plurality of open regions 1126 for exposing the surfaces of the substrates 1230 mounted on the jig 1210.

The open regions 1126 expose only the surfaces of the substrates 1230, while they do not expose the surface of the jig 1210. That is, the diameter of each of the open regions 1126 may be identical to or smaller than that of the substrate 1230.

The cover rods 1124 of the jig cover 1120 may be connected to a moving apparatus (not shown) for moving the jig cover 1120 in a vertical direction.

In this case, a cassette 1200 may be mounted to the semiconductor device fabricating apparatus 1000.

The cassette 1200 has a plurality of jigs 1210 mounted therein, which may be loaded in layers.

The cassette 1200 is mounted to the loadlock chamber 1300 of the semiconductor device fabricating apparatus 1000, so that the cassette can serve to supply the jigs 1210 into the semiconductor device fabricating apparatus 1000.

Hereinafter, a method of fabricating a semiconductor device according to an embodiment of the present invention will be described in detail with reference to FIGS. 20 to 23.

First, the cassette 1200 having the plurality of jigs 1210 loaded in layers is prepared.

At this time, the jigs 1210 may be in a state where they have undergone other processing processes in other semiconductor fabricating apparatuses (not shown).

Subsequently, the cassette 1200 with the plurality of jigs 1210 mounted therein is transferred and then mounted to the loadlock chamber 1300 of the semiconductor device fabricating apparatus 1000.

In this case, although not shown in FIG. 21, the cassette 1200 is transferred in a state where the cassette 1200 is loaded into a nitrogen-charged box in which nitrogen gas is charged.

Even when the cassette 1200 is separated and transferred from the semiconductor device fabricating apparatus 1000 after it has completely undergone a processing process in the semiconductor device fabricating apparatus 1000, the cassette 1200 may be transferred in a state where the cassette 1200 is loaded into the nitrogen-charged box. This is to prevent the substrates 1230 in the cassette 1200 from being exposed to the external environment.

Then, a robot arm (not shown) in the semiconductor device fabricating apparatus 1000 horizontally transfers any of the jigs 1210 in the cassette 1200 and loads it onto the jig loading chuck 1110 of the processing chamber 1100 (S100).

At this time, since the jig 1210 has the plurality of substrates 1230 mounted thereon, the plurality of substrates 1230 can be simultaneously loaded onto the jig loading chuck 1110 in the horizontal direction.

Conventionally, in order to load a plurality of substrates, loading processes were repeated as frequent as the number of the substrates. However, in the present invention, since the jig 1210 with the plurality of substrates 1230 mounted thereon is loaded as described above, the plurality of substrates 1230 can be loaded by means of only one loading process. Accordingly, it is possible to reduce the substrate loading time, i.e., the entire process time, thereby reducing the process time in mass production.

Subsequently, the surface of the jig 1210 is covered with the jig cover 1120 by moving the jig cover 1120 onto the jig 1210 (S200). Since the jig cover 1120 has the plurality of open regions for exposing the plurality of substrates 1230, the surfaces of the substrates 1230 are exposed.

Then, the semiconductor device fabricating apparatus 1000 processes the substrates 1230 (S300). That is, the semiconductor device fabricating apparatus 1000 performs a substrate treating process such as a process of growing an epitaxial layer on the surface of the substrate 1230 or a process of etching the surface of the substrate 1230.

Subsequently, after the substrate treating process is completed, the jig cover 1120 is moved to open the jig 1210. Then, the jig 1210 is unloaded from the processing chamber 1100 of the semiconductor device fabricating apparatus 1000 (S400) and transferred into the cassette 1200, thereby completing the substrate treating process for the one jig 1210.

Then, other jigs 1210 that have not yet been processed among the jigs 1210 mounted in the cassette 1200 are loaded into the semiconductor device fabricating apparatus 1000, and the substrate treating process described above is repetitively performed.

After the jigs 1210 mounted in the cassette 1200 have undergone the substrate treating process in the semiconductor device fabricating apparatus 1000, the cassette 1200 may be separated from the semiconductor device fabricating apparatus 1000 and then transferred to another semiconductor device fabricating apparatus. In this case, the cassette 1200 may be transferred in a state where the cassette 1200 is loaded into the nitrogen-charged box.

Although the various embodiment of the present invention have been described above, these embodiments are only for better understanding of the present invention and are not intended to limit the present invention. It will be understood by those skilled in the art that modifications and changes can be made to the present invention based on the disclosures herein without departing from the spirit and scope of the invention and that equivalents of such modifications and changes also fall within the scope of the present invention.

The invention claimed is:

1. A light-emitting diode (LED), comprising:
    a conductive substrate; and
    a gallium nitride (GaN)-based semiconductor stack disposed on the conductive substrate,
    wherein:
    the semiconductor stack comprises an active layer comprising a semi-polar semiconductor material; and
    the LED is free of a growth substrate.

2. The LED of claim 1, wherein the GaN-based semiconductor stack comprises semiconductor layers disposed on a semi-polar GaN substrate.

3. The LED of claim 2, wherein the semi-polar GaN substrate comprises miscut semi-polar GaN having a principal surface inclined at an angle ranging from 15 to 85 degrees with respect to c-plane.

4. The LED of claim 3, wherein the conductive substrate is the semi-polar GaN substrate.

5. The LED of claim 1, wherein the conductive substrate comprises a metal.

6. The LED of claim 5, further comprising a reflective layer disposed between the conductive substrate and the semiconductor stack.

7. The LED of claim 1, further comprising a transparent oxide layer disposed on the semiconductor stack.

8. The LED of claim 7, wherein the transparent oxide layer comprises a first surface comprising a concavo-convex pattern.

9. The LED of claim 8, wherein the transparent oxide layer comprises indium tin oxide (ITO) or zinc oxide (ZnO).

10. The LED of claim 8, wherein an upper surface of the semiconductor stack contacting the transparent oxide layer comprises a concavo-convex pattern.

11. A method of fabricating a light-emitting diode (LED), the method comprising:
    preparing a miscut semi-polar GaN substrate comprising a first surface inclined at an angle ranging from 15 to 85 degrees with respect to c-plane;
    growing semi-polar GaN-based semiconductor layers on the first surface of the semi-polar GaN substrate to form a semiconductor stack;
    forming a reflective layer on the semiconductor stack;
    attaching a support substrate on the reflective layer; and
    removing the semi-polar GaN substrate.

12. The method of claim 11, further comprising forming a transparent oxide layer on the semiconductor stack.

13. The method of claim 12, wherein the transparent oxide layer comprises a concavo-convex pattern formed in a surface thereof.

14. The method of claim 11, further comprising:
using electrochemical etching to form a nitride layer comprising a porous structure on the semi-polar GaN substrate, before forming the semiconductor stack on the semi-polar GaN substrate.

15. The method of claim 14, wherein the nitride layer separates the semi-polar GaN substrate from the semiconductor stack.

16. The method of claim 11, further comprising:
forming a concavo-convex pattern on a surface of the semiconductor stack, after the semi-polar GaN substrate is removed.

17. The method of claim 16, further comprising:
forming a transparent oxide layer on the semiconductor stack.

18. The method of claim 17, wherein a surface of the transparent oxide layer comprises a concavo-convex pattern.

19. The method of claim 17, wherein the transparent oxide layer comprises ITO or ZnO.

* * * * *